US012787199B2

(12) United States Patent
Wingfield et al.

(10) Patent No.: US 12,787,199 B2
(45) Date of Patent: Nov. 3, 2026

(54) SYSTEMS AND METHODS FOR LOW-PROFILE COUPLING OF AN INFORMATION HANDLING RESOURCE TO AN INFORMATION HANDLING SYSTEM CHASSIS

(71) Applicant: Dell Products L.P., Round Rock, TX (US)

(72) Inventors: Megan Cherie Wingfield, Box Elder, SD (US); Bernard D. Strmiska, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 22 days.

(21) Appl. No.: 18/415,407

(22) Filed: Jan. 17, 2024

(65) Prior Publication Data

US 2025/0234472 A1 Jul. 17, 2025

(51) Int. Cl.
*H05K 7/00* (2006.01)
*H05K 7/14* (2006.01)

(52) U.S. Cl.
CPC .................................. *H05K 7/1417* (2013.01)

(58) Field of Classification Search
None
See application file for complete search history.

(56) References Cited

U.S. PATENT DOCUMENTS

| | | | | |
|---|---|---|---|---|
| 5,231,561 A * | 7/1993 | Johnson | H05K 7/1417 174/359 |
| 6,213,330 B1 * | 4/2001 | Rufo, Jr. | G11B 33/0427 |
| 7,430,129 B1 * | 9/2008 | Peng | H05K 7/1417 361/742 |
| 9,750,148 B1 * | 8/2017 | Huang | H05K 5/0208 |
| 10,732,680 B1 * | 8/2020 | Lu | G11B 33/128 |
| 11,089,708 B1 * | 8/2021 | Lin | H05K 7/1417 |
| 11,189,322 B1 * | 11/2021 | Lu | G11B 33/124 |
| 2010/0050425 A1 * | 3/2010 | Ji | H05K 7/1417 29/739 |
| 2013/0343015 A1 * | 12/2013 | Malek | G06F 1/183 361/752 |
| 2014/0355182 A1 * | 12/2014 | Wang | H05K 7/14 361/679.01 |
| 2015/0289399 A1 * | 10/2015 | Liao | H05K 5/15 361/747 |
| 2015/0366087 A1 * | 12/2015 | Ide | H05K 3/4038 361/753 |
| 2018/0235100 A1 * | 8/2018 | Lee | G11B 33/124 |
| 2019/0281722 A1 * | 9/2019 | Tsutsui | H05K 7/14322 |

FOREIGN PATENT DOCUMENTS

| | | | |
|---|---|---|---|
| KR | 2011080457 A * | 7/2011 | H05K 5/0217 |

* cited by examiner

*Primary Examiner* — Steven M Marsh
(74) *Attorney, Agent, or Firm* — Jackson Walker L.L.P.

(57) ABSTRACT

A system may include a first mechanical member comprising a first engagement feature configured to mechanically couple to a second engagement feature of a second mechanical member. The first engagement feature may include a first bridge form protruding from the first mechanical member. The first bridge form may be configured to mechanically engage with a first recess formed in the second mechanical member and with a second bridge form protruding from the second mechanical member.

23 Claims, 3 Drawing Sheets

SYSTEMS AND METHODS FOR LOW-PROFILE COUPLING OF AN INFORMATION HANDLING RESOURCE TO AN INFORMATION HANDLING SYSTEM CHASSIS

TECHNICAL FIELD

The present disclosure relates to modular information handling systems. More specifically, embodiments of the disclosure provide systems and methods for low-profile coupling of an information handling resource to an information handling system chassis.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems and other information handling resources (e.g., storage devices, input/output devices, and other peripheral devices) are each manufactured in a modular form factor and may be configured to be disposed in a chassis configured to receive such modular components. Such a chassis and its component modular information handling systems and information handling resources typically include various rails, carriers, and other mechanical components allowing for a person to add and remove the modular information handling systems and information handling resources to and from the chassis.

In an information handling system, a circuit board may be mechanically coupled to a removable tray configured to mechanically couple to a chassis configured to house components of the information handling system. Each component on a circuit board has an associated "keep-out-zone" (KOZ) where there can be no interference with other parts. KOZs may be located on both sides of the circuit board. As computing abilities increase, there has been a corresponding increase in board component density, resulting in increases in the size and number of KOZs. However, current engagement features for coupling a removable tray to a chassis frequently interfere with these circuit board KOZs. Thus, low-profile engagement features may be desired.

SUMMARY

In accordance with the teachings of the present disclosure, the disadvantages and problems associated with traditional approaches to mechanically coupling a circuit board to a chassis may be substantially reduced or eliminated.

In accordance with embodiments of the present disclosure, a system may include a first mechanical member comprising a first engagement feature configured to mechanically couple to a second engagement feature of a second mechanical member. The first engagement feature may include a first bridge form protruding from the first mechanical member. The first bridge form may be configured to mechanically engage with a first recess formed in the second mechanical member and with a second bridge form protruding from the second mechanical member.

In accordance with embodiments of the present disclosure, a method may include mechanically coupling a first engagement feature of a first mechanical member to a second engagement feature of a second mechanical member. The first engagement feature may comprise a first bridge form protruding from the first mechanical member, the first bridge form configured to mechanically engage with a first recess formed in the second mechanical member and with a second bridge form protruding from the second mechanical member.

In accordance with embodiments of the present disclosure, a method may include forming a first bridge form protruding from a first mechanical member, the first bridge form configured to mechanically engage with a first recess formed in a second mechanical member and with a second bridge form protruding from the second mechanical member.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1A:
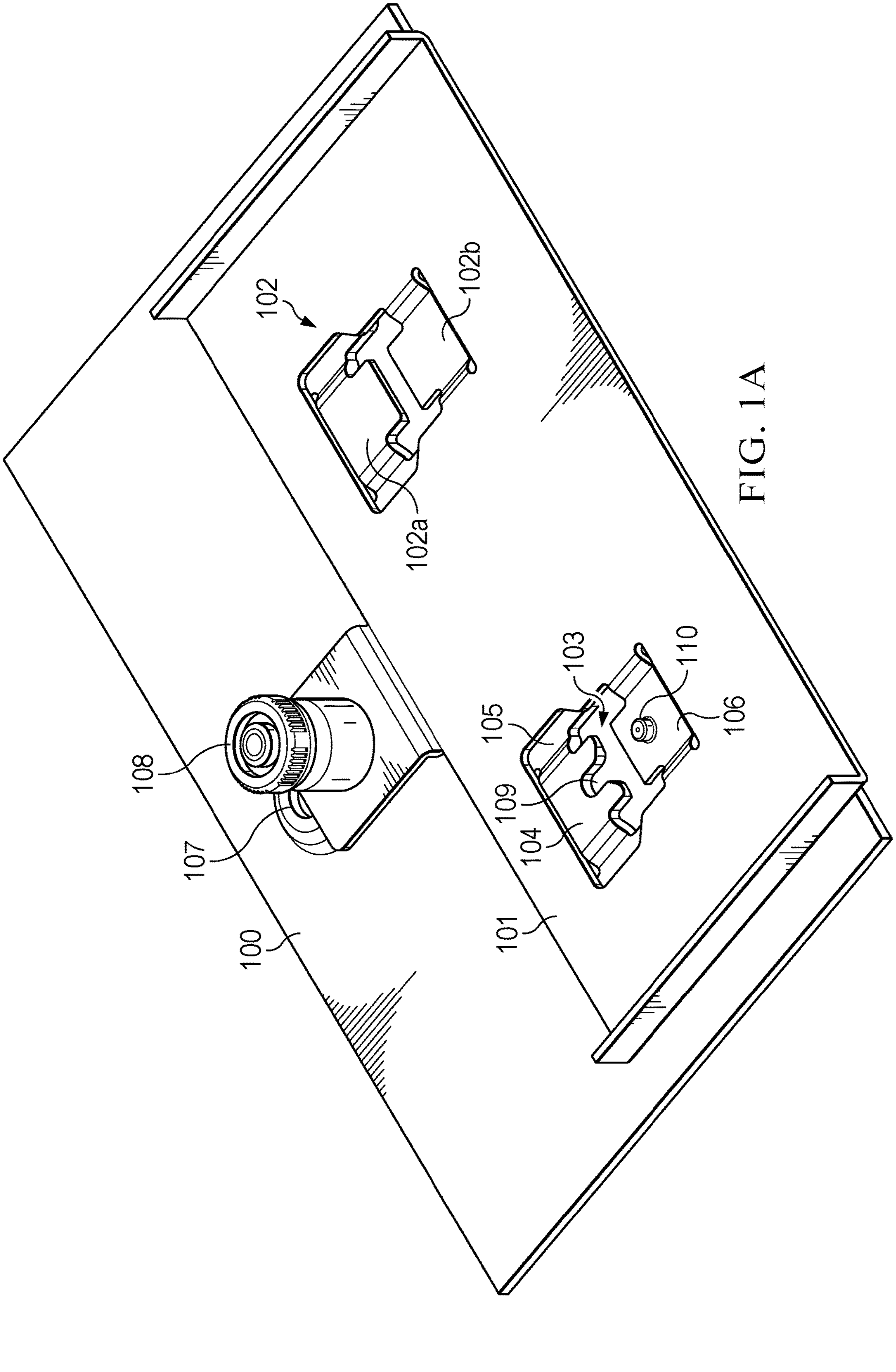
FIGS. 1A and 1B illustrate a "top-down" perspective view of an example removable tray engaging with an example chassis, in accordance with embodiments of the present disclosure.
Figure 1B:
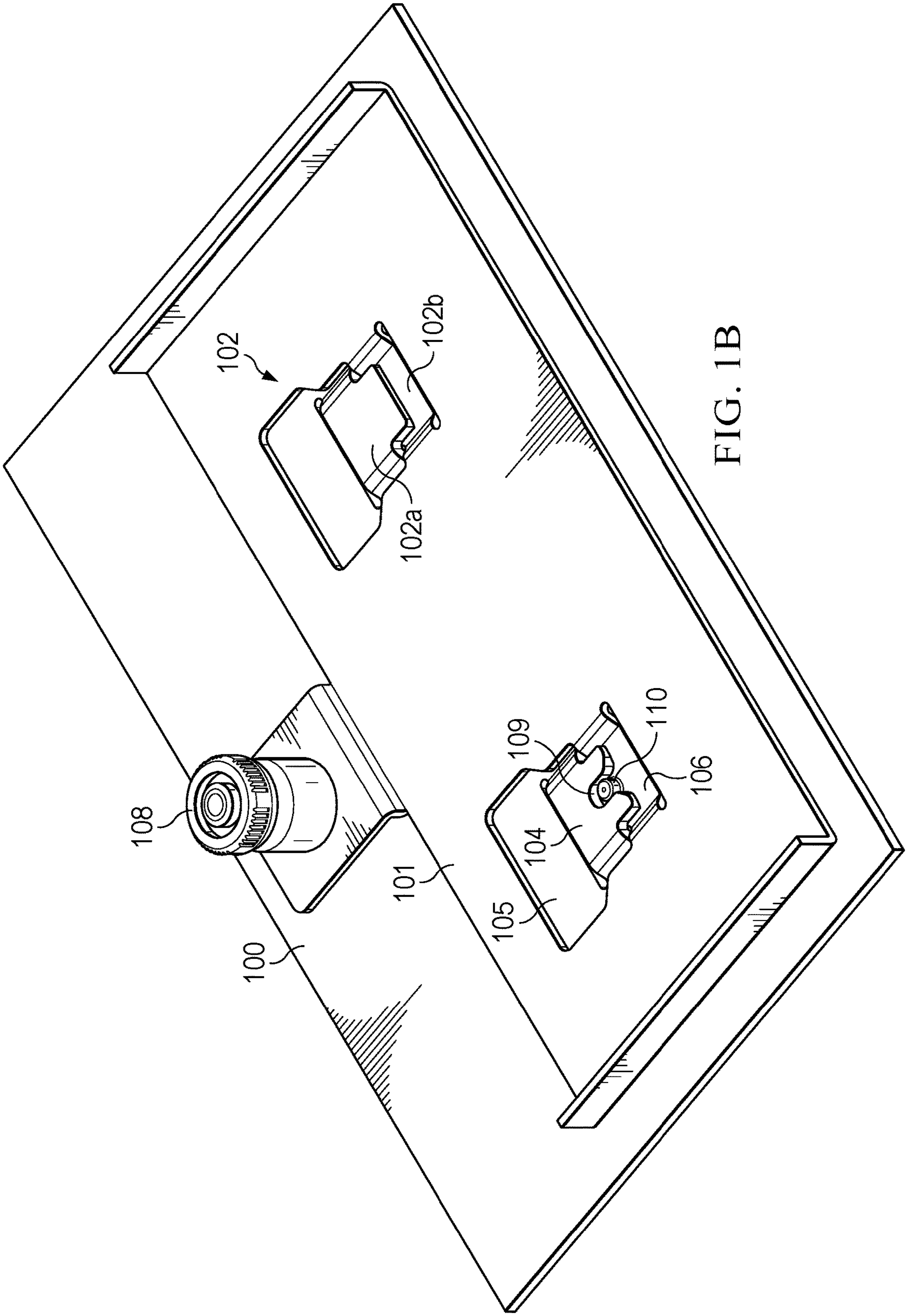
Figure 2:
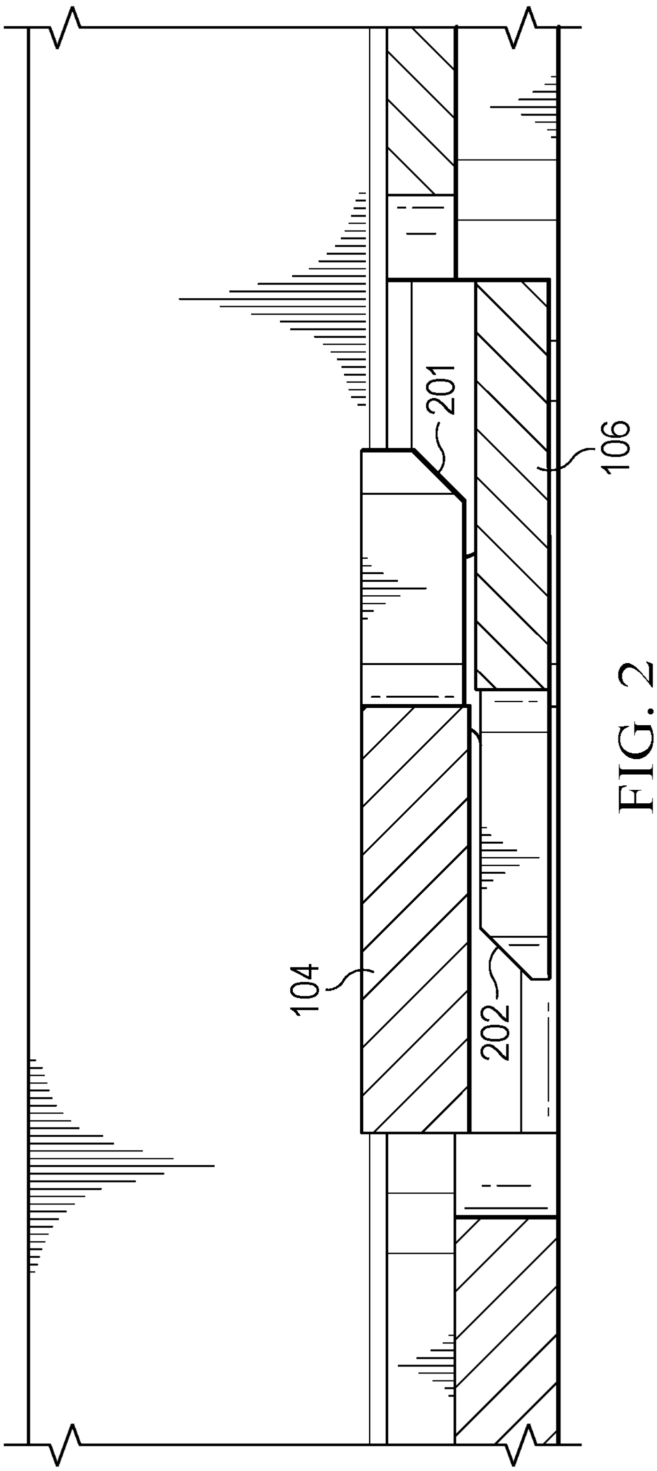
FIG. 2 illustrates a cross-sectional view of an example removable tray engaged with an example chassis, in accordance with embodiments of the present disclosure.

Preferred embodiments and their advantages are best understood by reference to FIGS. 1A through 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs) etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIGS. 1A and 1B illustrate a "top-down" perspective view of an example removable tray 101 (e.g., for carrying an information handling resource) engaging with an example chassis 100, in accordance with embodiments of the present disclosure. Chassis 100 may comprise an enclosure that serves as a container for one or more information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In some embodiments, chassis 100 may be configured to hold and/or provide power to a plurality of information handling resources.

As shown in FIGS. 1A and 1B, a low-profile coupling system may include a plurality of pairs of engagement features 102 configured to mechanically couple removable tray 101 to chassis 100 in a low-profile manner. Removable tray 101 may comprise one (102*b*) of each pair of engagement features 102, which may include a recess 105 in removable tray 101 and a bridge form 106 extending "down" from a surface of removable tray 101. Chassis 100 may comprise the other (102*a*) of each pair of engagement features 102, which may include a recess 103 and a bridge form 104 protruding "up" from a surface of chassis 100. While not shown in FIGS. 1A and 1B, removable tray 101 may be configured to mechanically couple to a circuit board on a "top" surface of removable tray 101.

In operation, bridge form 106 of removable tray 101 may align with and protrude "down" through recess 103 of chassis 100, and bridge form 104 of chassis 100 may align with and protrude "up" through recess 105 of removable tray 101. Removable tray 101 may slide relative to chassis 100 in a linear direction until bridge form 104 and bridge form 106 overlap, which may constrain movement of removable tray 101 and chassis 100 in a direction substantially perpendicular to and out of plane with the linear direction in which removable tray 101 slides (e.g., constrains movement "down" or "up"). Bridge form 106 and bridge form 104 may be configured such that when they are mechanically engaged, bridge form 104 does not substantially interfere with keep-out-zones or "KOZs" (e.g., areas of a circuit board where no components may be coupled) of a circuit board mechanically coupled to a top surface of removable tray 101 (not shown). In some embodiments, KOZs may be located on both sides of the circuit board. Thus, chassis 100 and removable tray 101 may mechanically couple in a low-profile manner. For example, in some embodiments, bridge form 104 may protrude approximately 0.3 mm above a top surface of removable tray 101. In some embodiments, a top surface of bridge form 104 may be approximately level with the top surface of removable tray 101.

In some embodiments, removable tray 101 may further comprise plunger 108, and chassis 100 may further comprise a plunger retention feature 107. Plunger 108 may comprise any system, device, or apparatus that is mechanically coupled to removable tray 101 and is configured to, responsive to human interaction or other physical interaction with plunger 108, move in a limited distance in an axis perpendicular to that of the surface of removable tray 101. In some embodiments, plunger 108 may include a spring to bias plunger 108 in a "down" position (e.g., in a downward direction with respect to FIGS. 1A and 1B), and a human may interact with plunger 108 with a force sufficient to overcome the spring force in order to move plunger 108 to an "up" position (e.g., in an upward direction with respect to FIGS. 1A and 1B).

Plunger 108 may include a feature configured to mechanically engage with plunger retention feature 107 of chassis 100. While plunger retention feature 107 is depicted in FIGS. 1A and 1B as a recess formed through chassis 100, plunger retention feature 107 may comprise any suitable mechanical feature for mechanically engaging with plunger 108, including without limitation recesses, embosses, indentations, or detents. When plunger 108 is engaged with plunger retention feature 107, the mechanical coupling of plunger 108 with chassis 100 may further constrain movement of removable tray 101 relative to chassis 100.

In some embodiments, bridge form 104 of chassis 100 may further comprise a slot 109 configured to mechanically engage with a protrusion 110 extending substantially perpendicular from bridge form 106 of removable tray 101. When protrusion 110 is engaged with slot 109, the mechanical coupling may further constrain lateral movement of removable tray 101 relative to chassis 100. While protrusion 110 is shown as a cylindrically-shaped member and slot 109 is shown as a substantially circular opening, protrusion 110 and slot 109 may have any other suitable shape.

While the terms "top," "bottom," "up," and "down" are used for purposes of clarity and exposition in the present disclosure, these terms are not intended to limit the features of removable tray 101 or chassis 100.

FIG. 2 illustrates a cross-sectional view of an example removable tray 101 engaged with an example chassis 100 via an example pair of engagement features 102, in accordance with embodiments of the present disclosure. As shown in FIG. 2, in some embodiments bridge form 106 of removable tray 101 and bridge form 104 of chassis 100 may each comprise chamfered edges 202 and 201, respectively, to facilitate mechanical coupling. In some embodiments, bridge form 106 and bridge form 104 may be formed through any suitable method (e.g., coining) such that bridge form 106 and bridge form 104 are sufficiently thin such that bridge form 104 does not substantially interfere with a KOZ of a circuit board mechanically coupled to removable tray 101. Thus, chassis 100 and removable tray 101 may mechanically couple in a low-profile manner. For example, in some embodiments, bridge form 104 may protrude approximately 0.3 mm above a top surface of removable tray 101. In some embodiments, a top surface of bridge form 104 may be approximately level with the top surface of removable tray 101.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising:

a first mechanical member comprising a first engagement feature, wherein the first engagement feature comprises a first bridge form protruding from the first mechanical member; and a second mechanical member comprising a second engagement feature, wherein the second engagement feature comprises a first recess and a second bridge form, and wherein the first bridge form is configured to mechanically engage with the first recess formed in the second mechanical member and with the second bridge form protruding from the second mechanical member.

2. The system of claim 1, wherein the first mechanical member comprises a chassis.

3. The system of claim 1, wherein the second mechanical member comprises a removable tray.

4. The system of claim 1, wherein the first mechanical member further comprises a plunger retention feature configured to mechanically engage with a spring-loaded plunger of the second mechanical member.

5. The system of claim 1, wherein the first engagement feature further comprises a second recess configured to mechanically engage with the second bridge form protruding from the second mechanical member.

6. The system of claim 1, wherein the second bridge form comprises a protrusion extending substantially perpendicular from the second bridge form, and wherein the protrusion is configured to mechanically engage with a slot formed in the first bridge form.

7. The system of claim 1, wherein the first mechanical member is configured such that when the second mechanical member slides in a linear direction relative to the first mechanical member, the first bridge form overlaps with the second bridge form and prevents movement of the first mechanical member and the second mechanical member in a direction substantially perpendicular to and out of plane with the linear direction.

8. The system of claim 1, wherein at least one of the first bridge form and the second bridge form comprises a chamfered edge.

9. A method comprising:

mechanically coupling a first engagement feature of a first mechanical member to a second engagement feature of a second mechanical member, wherein the first engagement feature comprises a first bridge form protruding from the first mechanical member, such that the first bridge form is mechanically engages with a first recess formed in the second mechanical member and with a second bridge form protruding from the second mechanical member; and mechanically coupling a plunger retention feature of the first mechanical member to a spring-loaded plunger feature of the second mechanical member.

10. The method of claim 9, wherein the first mechanical member comprises a chassis.

11. The method of claim 9, wherein the second mechanical member comprises a removable tray.

12. The method of claim 9, wherein the first engagement feature further comprises a second recess configured to mechanically engage with the second bridge form protruding from the second mechanical member.

13. The method of claim 9, wherein the second bridge form comprises a protrusion extending substantially perpendicular from the second bridge form, and wherein the protrusion is configured to mechanically engage with a slot formed in the first bridge form.

14. The method of claim 9, wherein mechanically coupling the first engagement feature to the second engagement feature comprises sliding the second mechanical member in a linear direction relative to the first mechanical member until the first bridge form overlaps the second bridge form such that movement of the first mechanical member and the second mechanical member is prevented in a direction substantially perpendicular to and out of plane with the linear direction.

15. The method of claim 9, wherein at least one of the first bridge form and the second bridge form comprises a chamfered edge.

16. A method comprising:

forming a first bridge form protruding from a first mechanical member; and forming a first recess in a second mechanical member and a second bridge form protruding from the second mechanical member, wherein the first bridge form is configured to mechanically engage with the first recess formed in the second mechanical member and with the second bridge form protruding from the second mechanical member.

17. The method of claim 16, wherein the first mechanical member comprises a chassis.

18. The method of claim 16, wherein the second mechanical member comprises a removable tray.

19. The method of claim 16, further comprising mechanically coupling a spring-loaded plunger feature to the second mechanical member, wherein the spring-loaded plunger feature is configured to mechanically engage with a plunger retention feature of the first mechanical member.

20. The method of claim 16, further comprising forming a protrusion on and extending substantially perpendicular from the second bridge form, wherein the protrusion is configured to mechanically engage with a slot in the first bridge form.

21. The method of claim 16, further comprising forming a second recess in the first mechanical member configured to mechanically engage with the second bridge form protruding from the second mechanical member.

22. The method of claim 16, wherein the first bridge form is configured to overlap with the second bridge form.

23. The method of claim 16, wherein at least one of the first bridge form and the second bridge form comprises a chamfered edge.

* * * * *